(12) United States Patent
Kim (10) Patent No.: US 12,412,765 B2
(45) Date of Patent: Sep. 9, 2025

(54) METHOD AND APPARATUS FOR CONTROLLING WAFER TRANSFER ROBOT USING STATIC ELECTRICITY PREDICTION

(71) Applicant: GSF Solution Co., Ltd., Chungcheongbuk-do (KR)

(72) Inventor: Dong Hyun Kim, Chungcheongbuk-do (KR)

(73) Assignee: GSF SOLUTION CO., LTD., Chungcheongbuk-Do (KR)

( * ) Notice: Subject to any disclaimer, the term of this patent is extended or adjusted under 35 U.S.C. 154(b) by 68 days.

(21) Appl. No.: 18/599,210

(22) Filed: Mar. 8, 2024

(65) Prior Publication Data

US 2024/0304483 A1     Sep. 12, 2024

(30) Foreign Application Priority Data

Mar. 9, 2023 (KR) .................. 10-2023-0030882

(51) Int. Cl.
| | |
|---|---|
| *H05F 3/00* | (2006.01) |
| *B25J 9/16* | (2006.01) |
| *B25J 11/00* | (2006.01) |
| *B25J 13/08* | (2006.01) |
| *H01L 21/677* | (2006.01) |

(52) U.S. Cl.
CPC .......... *H01L 21/677* (2013.01); *B25J 9/1651* (2013.01); *B25J 11/0095* (2013.01); *B25J 13/087* (2013.01); *H05F 3/00* (2013.01)

(58) Field of Classification Search
CPC .... B25J 9/1651; B25J 11/0095; B25J 13/087; H05F 3/00; H01L 21/677
See application file for complete search history.

(56) References Cited

U.S. PATENT DOCUMENTS

| | | | | |
|---|---|---|---|---|
| 2021/0118719 A1* | 4/2021 | Wilkas | ............... | H01L 21/67155 |
| 2021/0313157 A1* | 10/2021 | Mao | .................... | H01L 21/6833 |
| 2022/0037177 A1* | 2/2022 | Fukuzaki | ................. | G01B 7/14 |
| 2023/0005749 A1* | 1/2023 | Yamaguchi | ....... | H01L 21/32135 |
| 2023/0223293 A1* | 7/2023 | Jiang | .................... | H01L 21/6831 |
| | | | | 206/710 |

FOREIGN PATENT DOCUMENTS

| | | |
|---|---|---|
| JP | 2001338966 A | 12/2001 |
| KR | 20020073318 A | 9/2002 |
| KR | 20230030882 A | 3/2023 |

* cited by examiner

*Primary Examiner* — Dalena Tran
(74) *Attorney, Agent, or Firm* — Panitch Schwarze Belisario & Nadel LLP (57) ABSTRACT

The present invention relates to a method of controlling a wafer transfer robot using static electricity prediction, and the method includes acquiring, when a wafer is transported by an end effector of the wafer transfer robot, temperature and humidity data around the wafer from a temperature sensor and a humidity sensor of a static elimination system installed in a non-contact manner with the end effector of the transfer robot, predicting an electrostatic voltage by substituting the acquired data into a predetermined humidity-electrostatic voltage graph, calculating a static elimination time of the predicted electrostatic voltage, performing static elimination on the wafer during the calculated static elimination time, and adjusting a transfer speed of the transfer robot based on the calculated static elimination time.

14 Claims, 7 Drawing Sheets

METHOD AND APPARATUS FOR CONTROLLING WAFER TRANSFER ROBOT USING STATIC ELECTRICITY PREDICTION

CROSS-REFERENCE TO RELATED APPLICATION

This application claims priority to and the benefit of Korean Patent Application No. 2023-0030882 filed on Mar. 9, 2023, the disclosure of which is incorporated herein by reference in its entirety.

BACKGROUND

1. Field of the Invention

The present invention relates to a method and apparatus for controlling a wafer transfer robot using static electricity prediction, and more specifically, to providing a method of efficiently eliminating static electricity of a wafer by predicting an electrostatic voltage using various sensors and controlling a speed of the wafer transfer robot.

2. Discussion of Related Art

Robotic transferring of products such as semiconductors, secondary batteries, or liquid crystal displays involves repetitive motion in the form of a procedure of continuously moving a specific point. However, in this manufacturing process, a situation occurs in which static electricity remains on the product due to the influence of the process or environmental influences. When electricity of a high voltage flows temporarily in a semiconductor wafer due to an electrostatic discharge, an insulating layer such as silicon oxide, which has a high insulating property, is broken and an IC circuit therein is destroyed. In particular, recent advances in light weight and miniaturization have made semiconductor devices highly susceptible to static electricity disturbances, and the finer and more complex the device, the narrower spacing between lines, and the smaller the device itself, the lower the static electricity immunity, and therefore more advanced electrostatic management measures are required.

Therefore, there are proposals to solve this static electricity problem, such as a method of using static eliminators in certain processes to offset the static electricity or constructing conductive materials so that a part in contact with the product may be grounded, but there is still no way to monitor the amount of static electricity at all times. In addition, since the manufacturing process is usually performed 24 hours per day, 365 days per year without interruption, it is difficult to monitor the amount of static electricity every time even when there is a problem during the transfer of the product.

RELATED ART DOCUMENT

Patent Document (Patent Document 1) Korean Registered Patent Publication No. 10-1114617 (Mar. 5, 2012)

SUMMARY OF THE INVENTION

The present invention is directed to providing a method and apparatus for controlling a wafer transport robot using static electricity prediction, which can predict an electrostatic voltage from temperature and humidity sensors included in a static elimination system (including a static elimination function and a sensor function).

The present invention is also directed to providing a method and apparatus for controlling a wafer transport robot using static electricity prediction, which can predict a static elimination time to reach the target electrostatic voltage to control a wafer transfer speed of a robot so that the static electricity can be eliminated more efficiently.

The present invention is also directed to providing a method and apparatus for controlling a wafer transport robot using static electricity prediction, which can provide data collected from a static elimination system to a system server to enable predictive maintenance.

However, the technical problem to be solved by the present invention is not limited to the above-mentioned problems, and other problems that have not been mentioned can be clearly understood by those skilled in the art from the description of the invention described below.

According to an aspect of the present invention, there is provided a method of controlling a wafer transfer robot using static electricity prediction, including: acquiring, when a wafer is transported by an end effector of the wafer transfer robot, temperature and humidity data around the wafer from a temperature sensor and a humidity sensor of a static elimination system installed in a non-contact manner with the end effector of the transfer robot; predicting an electrostatic voltage by substituting the acquired data into a predetermined humidity-electrostatic voltage graph; calculating a static elimination time of the predicted electrostatic voltage; performing static elimination on the wafer during the calculated static elimination time; and adjusting a transfer speed of the transfer robot based on the calculated static elimination time.

The predicting of the electrostatic voltage may include statistically predicting the electrostatic voltage by performing average, high average, and highest data statistics and analysis processing.

The calculating of the static elimination time of the electrostatic voltage may include setting a target electrostatic voltage; calculating the static elimination time to the target electrostatic voltage based on performance data of a static eliminator included in the static elimination system to calculate a required static elimination time according to the electrostatic voltage; and correcting the calculated static elimination time based on the data acquired by the static elimination system.

The adjusting of the transfer speed may include: determining whether the predicted electrostatic voltage is greater than or equal to a predetermined value; comparing, when the predicted electrostatic voltage is greater than or equal to the predetermined value, the transfer speed of the transfer robot according to the calculated static elimination time with a basic transfer speed of the transfer robot, and adjusting, when the basic transfer speed of the current transfer robot is higher than the transfer speed of the transfer robot according to the static elimination time, the transfer speed of the transfer robot to the transfer speed of the transfer robot according to the static elimination time.

The static elimination system may be spaced apart from the end effector in the range of 50 to 200 mm.

The humidity-electrostatic voltage graph may be learned by measuring values that change depending on the environment and temperature of the transfer robot through the static elimination system.

The method of controlling the wafer transfer robot using static electricity prediction may further include: determining whether the electrostatic voltage is abnormal based on the acquired data; and comparing, when the electrostatic voltage is determined to be abnormal, the electrostatic voltage with data acquired from other processes to determine whether the abnormality is caused by an environmental factor, a transfer process problem, or a process problem.

According to another aspect of the present invention, there is provided an apparatus of controlling a wafer transfer robot using static electricity prediction, including: a static elimination system installed in a non-contact manner with an end effector of the transfer robot to acquire temperature and humidity data around a wafer and perform static elimination on the wafer, when the wafer is transported by the end effector of the transfer robot; a controller configured to predict an electrostatic voltage by substituting the acquired data into a predetermined humidity-electrostatic voltage graph and calculate a static elimination time of the predicted electrostatic voltage; and a robot controller configured to adjust a transfer speed of the transfer robot based on the calculated static elimination time, wherein the controller controls the static elimination system to perform static elimination during the calculated static elimination time.

The controller may statistically predict the electrostatic voltage by performing average, high average, and highest data statistics and analysis processing.

The controller may further perform setting a target electrostatic voltage, calculating a static elimination time to the target electrostatic voltage based on performance data of a static eliminator included in the static elimination system to predict a required static elimination time according to an electrostatic voltage, and correcting the predicted static elimination time based on the data acquired by the static elimination system.

The controller may determine whether the predicted electrostatic voltage is greater than or equal to a predetermined value, compare, when the predicted electrostatic voltage is greater than or equal to the predetermined value, the transfer speed of the transfer robot according to the calculated static elimination time with a basic transfer speed of the transfer robot, and transmit, when the basic transfer speed of the current transfer robot is higher than the transfer speed of the transfer robot according to the static elimination time, an adjustment value by which the transfer speed of the transfer robot is adjusted to a transfer speed of the transfer robot according to the static elimination time to the robot controller.

The static elimination system may be spaced apart from the end effector in the range of 50 to 200 mm.

The apparatus may further include a management system, and the management system may perform determining whether the electrostatic voltage is abnormal based on the acquired data, and comparing, when the electrostatic voltage is determined to be abnormal, the electrostatic voltage with data acquired from other processes to determine whether the abnormality is caused by an environmental factor, a transfer process problem, or a process problem.

According to still another aspect of the present invention, there is provided a program for controlling the wafer transfer robot using static electricity prediction, and the program may be combined with a computer, which is hardware, and may be stored in a medium to execute the method of controlling the wafer transfer robot using static electricity prediction.

Other specific matters of the present invention are included in the detailed description and drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

The advantages and features of the present invention, and methods of achieving them, will become apparent with reference to the embodiments described below in detail together with the accompanying drawings. However, the present invention is not limited to the embodiments disclosed below and may be implemented in various different forms, and these embodiments are provided merely to make the disclosure of the present invention complete and fully inform those skilled in the art to which the present invention belongs, and the present invention is defined by the scope of the claims.

Terminology used in the specification is for the purpose of describing the embodiments only and is not intended to be limiting of the present invention. In this specification, singular expressions include plural expressions unless the content clearly indicates otherwise. The terms "comprises" and/or "comprising" used in the specification do not exclude the presence or addition of one or more other components in addition to those mentioned. Like reference numerals refer to like components throughout the specification, and "and/or" includes each and every combination of one or more of the referenced components. Although the terms "first," "second," and the like are used to describe various components, these components are not limited by these terms. These terms are merely used to distinguish one component from other components. Therefore, it goes without saying that a first component mentioned below may also be a second component within the technical idea of the present invention.

Unless otherwise defined, all terms (including technical and scientific terms) used in this specification may be used with meanings commonly understood by those skilled in the art to which the present invention pertains. In addition, terms defined in commonly used dictionaries are not to be interpreted ideally or excessively unless clearly specifically defined.

Hereinafter, embodiments of the present invention will be described in detail with reference to the accompanying drawings.

Figure 1:
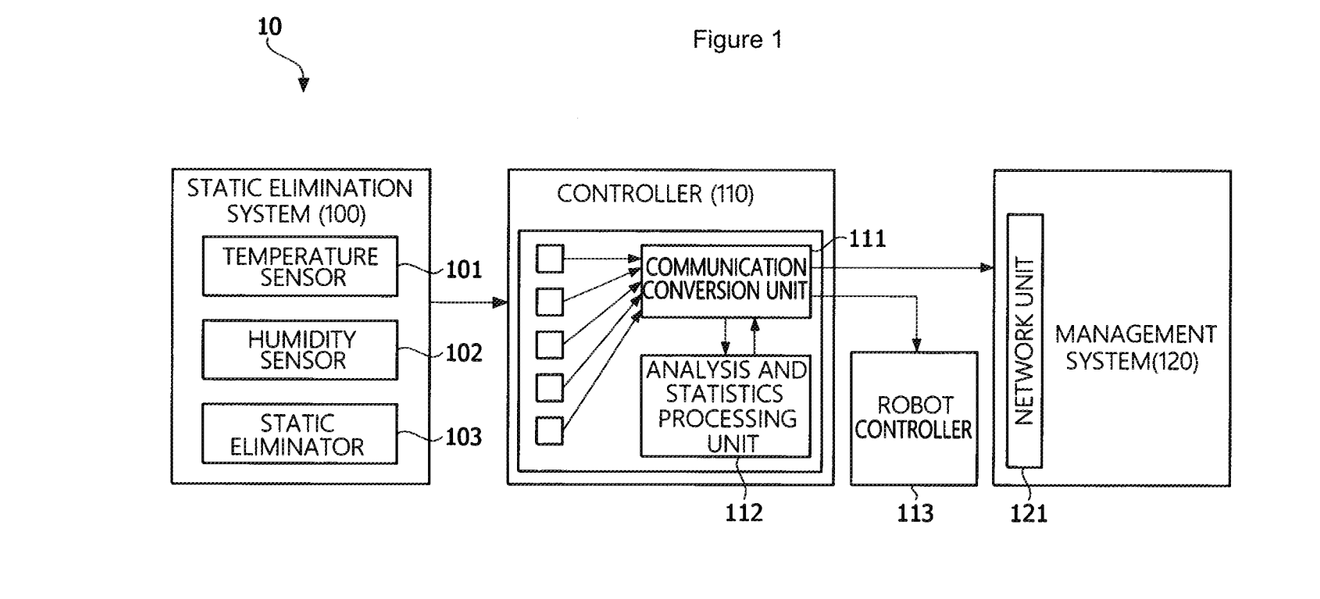
FIG. 1 is a conceptual diagram for schematically describing a configuration of a wafer transfer robot control apparatus using static electricity prediction according to one embodiment.

FIG. 1 is a diagram for schematically describing a configuration of a wafer transfer robot control apparatus using static electricity prediction according to one embodiment.

Referring to FIG. 1, a wafer transfer robot control apparatus 10 according to one embodiment may include a static elimination system 100, a controller 110, and a management system 120.

In addition, the static elimination system 100 according to one embodiment may include a temperature sensor 101, a humidity sensor 102, and a static eliminator 103, and may be installed in a non-contact manner with semiconductor products (e.g., wafers) transported by a transfer robot.

In general, since a semiconductor wafer is subjected to various processes, there is a phenomenon that static electricity remains in a product. The static electricity is a phenomenon that involves excessive charges caused by an imbalance of negative and positive charges on the surface of an object, and may be generated by contact and separation, crushing and splitting of solids, liquid flow, and inductive electrification.

In particular, the generation of static electricity in the semiconductor manufacturing process is a phenomenon in which excessive charges are collected on the surface of the product when the semiconductor product (wafer or die) is moved or processed, and is likely to be caused by friction or the flow of process chemicals.

Meanwhile, when static electricity is generated in the semiconductor products, a defect may occur in which the normal function of the product is lost due to the destruction of elements by damaging the electrode or the line of the electrode inside the product. In addition, the static electricity may cause particles to adhere to the product, which may cause performance abnormalities of the product as a result of defects of the elements after the process is carried out due to the particles.

Therefore, in order to prevent defects in such semiconductor products, it is necessary to have a system for static elimination, and especially when the product is moved, such as during the transfer stage, a non-contact type static elimination system is installed so that the amount of static electricity on the product may be predicted and eliminated without damaging the surface of the product.

Figure 2:
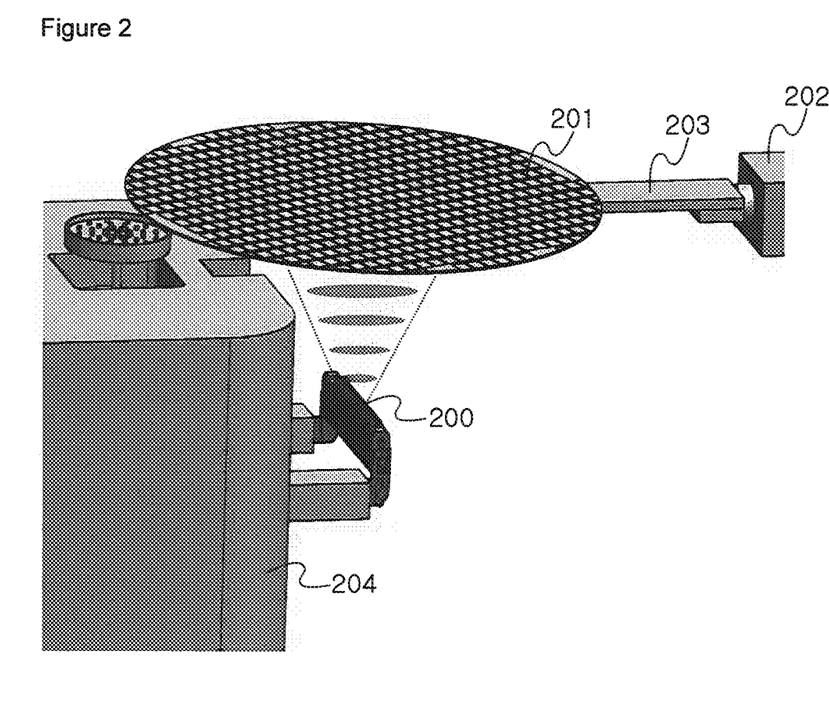
FIG. 2 is a diagram for describing a method of eliminating static electricity from a wafer transfer robot according to one embodiment.

For example, referring to FIG. 2, the wafer 201 may be transported by an end effector 203 of a transfer robot 202. Here, the end effector 203 is a device for transporting the semiconductor wafer 201 and may be a blade-shaped device. Of course, the end effector 203 is not necessarily limited to such a device. Meanwhile, the static elimination system 200 according to one embodiment may be installed in a non-contact manner with the wafer 201, and in consideration of the size and weight of the static elimination system 200, it is more efficient to install it on a fixed aligner 204 than on the transfer robot 202 that performs much movement, and the static elimination ability may be ensured by installing it perpendicularly to a direction in which the wafer 201 is transported. Meanwhile, the aligner 204 according to one embodiment may be a processing tool used to transfer a pattern to a silicon wafer through exposure in a semiconductor process, and is not necessarily limited to such a device. In addition, the position of the static elimination system 200 is not limited to installation on the aligner 204, and may be selected as a position to effectively eliminate static electricity from the wafer 201 in the same position.

In addition, the end effector 203 may hold a partial area of the wafer 201 and may not be in contact with the remaining area. For example, the end effector 203 may hold an edge area of one surface (e.g., a lower surface) of the wafer 201 while exposing a central area of one surface (e.g., a lower surface) of the wafer 201 to the outside. In addition, while the lower surface of the wafer 201 is seated on the end effector 203, the central area of the lower surface of the wafer 201 may be exposed to face the static elimination system 200.

When the wafer 201 is transported by the end effector 203 of the transfer robot 202, the static elimination system 200 is installed in a non-contact manner with the end effector 203 of the transfer robot 202 to acquire ambient temperature and humidity data and perform static elimination on the wafer 201. The temperature data is acquired by the temperature sensor 101, and the humidity data is acquired by the humidity sensor 102. In this case, the temperature sensor 101 and the humidity sensor 102 may each be provided at predetermined positions in the static elimination system 200, and may acquire temperature and humidity data around the wafer 201 disposed on the end effector 203. That is, the temperature and humidity data acquired from the temperature sensor 101 and the humidity sensor 102 are temperature and humidity data of a space where the static elimination system 200 is installed, and may be used as temperature and humidity data around the wafer 201.

The static elimination system 200 is installed in a non-contact manner with the wafer transported by the transfer robot 202, and the static elimination system 200 is spaced a predetermined distance from the wafer 201 disposed on the end effector 203. In this document, the temperature and humidity data around the wafer 201 disposed on the end effector 203 may be data measured in the space between the static elimination system 200 and the wafer 201 by virtue of the distance.

In addition, in this document, humidity data may include absolute humidity data and relative humidity data, and hereinafter, for convenience of explanation, the term "humidity" may be understood to refer to relative humidity.

Figure 3:
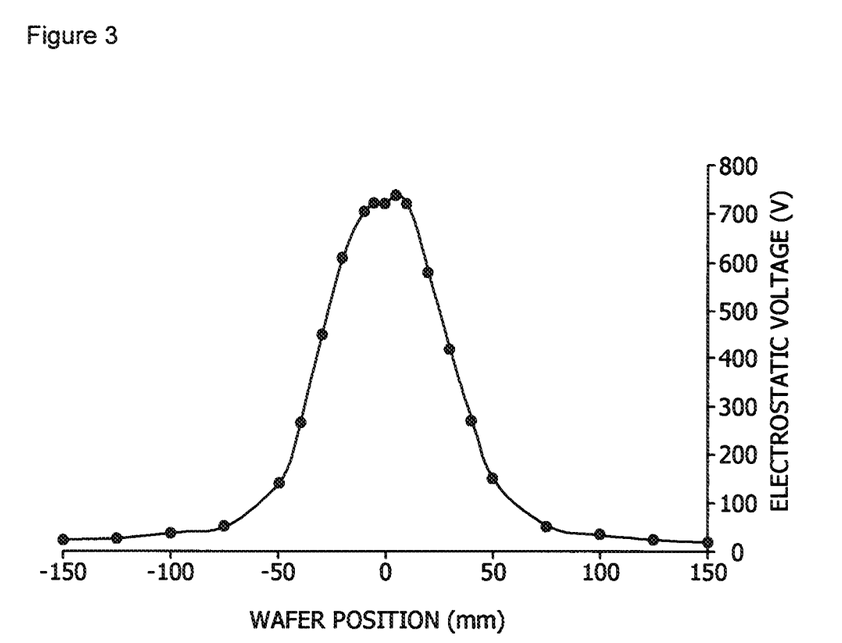
FIG. 3 is a graph showing electrostatic voltage distribution for each position at a wafer according to one embodiment.

Meanwhile, FIG. 3 is a graph showing electrostatic voltage distribution for each position at a wafer (300 mm wafer) according to one embodiment. Referring to FIG. 3, it may be seen that as the circuit patterns of semiconductor products become finer and more complex, less static electricity is discharged to the atmosphere and more is concentrated toward the center of the wafer (near 0 mm).

Figure 4:
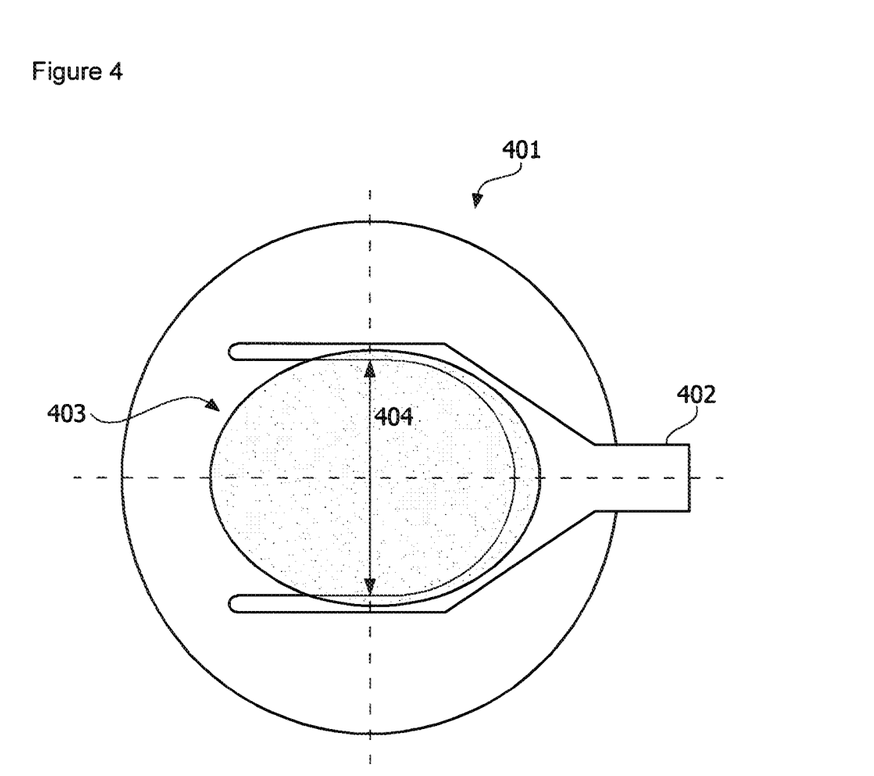
FIG. 4 is a diagram for describing a wafer static elimination range of a wafer transfer robot control apparatus according to one embodiment.

Accordingly, the static elimination system 200 according to one embodiment may be installed to eliminate static electricity of an area 403 other than an area held by the end effector 402 in the wafer 401, as shown in FIG. 4. For example, the area 403 in which static elimination is performed on a 300 mm wafer may be an elliptical range having a diameter 404 of about 150 mm from the center thereof.

Figure 5:
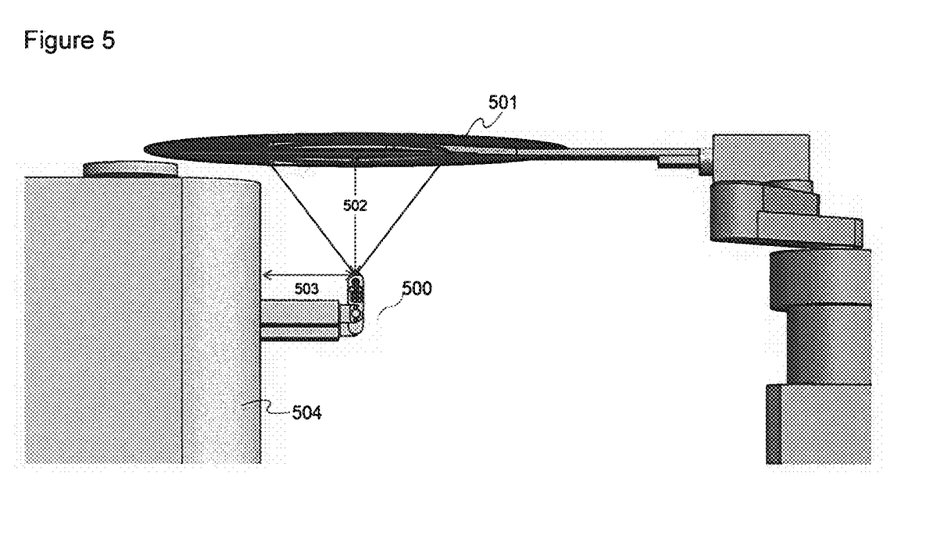
FIG. 5 is a diagram for describing position setting of a static elimination system according to one embodiment.

Meanwhile, FIG. 5 is a diagram for describing position setting of a static elimination system according to one embodiment. Referring to FIG. 5, a static elimination system 500 according to one embodiment may be installed at a position separated from the aligner 504 by a distance 503 of about 60 to 150 mm because the static elimination range is generated in a conical shape, and may be installed at a position separated from the wafer 501 by a distance 502 of about 50 to 200 mm to eliminate static electricity at a high speed.

Referring again to FIG. 1, the wafer transfer robot control apparatus 10 includes a controller 110 that predicts an electrostatic voltage by substituting the acquired data into a predetermined humidity-electrostatic voltage graph and calculates a static elimination time of the predicted electrostatic voltage.

A communication support method such as Ethernet/IP, MODBUS, CC-Link, DeviceNet, EtherCAT, RS-232C, RS-485, RS-422, BCD output, PROFINET, PROFIBUS, or the like may be supported between the static elimination system 100 and the controller 110 according to one embodiment. A network between the controller 110 and the management system 120 may support a protocol connection of OPC-UA, SOAP, TCP/IP, SECS-I, SECS-II, HSMS, and SECS-GEM methods. In order to implement a network communication driver, a communication protocol that the communication driver should have may be appropriately equipped, and a communication conversion unit 111 may communicate with the sensors through serial, parallax, and digital/analog input/output signals and the like for communication between the sensors and a communication module and may connect the collected signals with a network unit 121 of the management system 120 through a protocol, and the communication connection may be controlled so that the data is ultimately transmitted from the sensors to a server.

The controller 110 according to one embodiment may predict an electrostatic voltage based on data (temperature data and humidity data) acquired by the static elimination system 100 and calculate a static elimination time of the predicted electrostatic voltage. For example, the controller 110 may statistically predict the electrostatic voltage by performing average, high average, and highest data statistics and analysis processing.

In addition, the controller 110 may set a target electrostatic voltage and control the static elimination system 100 to eliminate static electricity until the target electrostatic voltage is reached. In the case of products including general semiconductors, an over-voltage protection circuit is designed therein to prevent damage to the product, and an electrostatic discharge (ESD) phenomenon is evaluated to meet international standards. Although a breakdown voltage of IC circuit components is generally considered to be 300 to 1000 V, in order to ensure more stability, some embodiments of the present invention will be described below under the assumption that the target voltage after elimination of static electricity is 250 V. However, the breakdown voltage range of the device may continue to vary with the development of IC circuits, so it is not necessarily limited to this configuration.

The controller 110 according to one embodiment may perform control such that operations of calculating a static elimination time to a target electrostatic voltage based on performance data of a static eliminator included in the static elimination system to calculate a required static elimination time according to an electrostatic voltage and correcting the calculated static elimination time based on data acquired by the static elimination system are performed. In addition, the controller 110 according to one embodiment may control the static elimination system 100 to perform static elimination on the semiconductor product during the calculated static elimination time.

In addition, the wafer transfer robot control apparatus 10 includes a robot controller 113 that adjusts the transfer speed of the transfer robot 202 based on the calculated static elimination time.

In addition, the controller 110 according to one embodiment may transmit a signal for controlling the transfer speed of the transfer robot based on the calculated static elimination time to the robot controller 113 to achieve more efficient static elimination.

For example, the controller 110 may determine whether the predicted electrostatic voltage is greater than or equal to a predetermined value, when the predicted electrostatic voltage is greater than or equal to a predetermined value, compare a basic transfer speed of the transfer robot with the transfer speed of the transfer robot according to the calculated static elimination time, and when the basic transfer speed of the current transfer robot is higher than the transfer speed of the transfer robot according to the static elimination time, transmit an adjustment value by which the transfer speed of the transfer robot is adjusted to the transfer speed of the transfer robot according to the static elimination time to the robot controller 113.

Meanwhile, the controller 110 may include one or more processors and/or one or more memories. In addition, the memory may include a volatile and/or non-volatile memory. One or more memories may store instructions that, when executed by one or more processors, cause one or more processors to perform operations. In addition, the controller 110 according to one embodiment may further include an analysis and statistics processing unit 112, and the analysis and statistics processing unit 112 may perform calculation processes such as electrostatic voltage prediction, static elimination time, and the like based on data collected from the static elimination system 100.

The management system 120 according to one embodiment may be implemented with a manufacturing execution system (MES), a fault detection and classification (FDC), and/or an equipment application program (EAP). For example, the MES may be a system that improves the efficiency of production management by handling production schedules, work instructions, material requirements, production tracking, facility management, and productivity performance analysis. The EAP may be a system for building a solution responsible for operating and controlling equipment through the connection between production/measurement equipment and the MES system. The FDC may mainly be implemented as a real-time equipment resource management and condition inspection system, and may collect and calculate the sensor values of the facility, determine the occurrence of abnormalities, and analyze the defects to monitor the malfunction of the facility in real time. Therefore, in the case of the wafer transfer robot control apparatus 10 shown in FIG. 1, the controller 110 and the management system 120 are shown as separate devices for convenience of explanation, but in reality, they may be implemented as a structure included in the FDC system.

The management system 120 according to one embodiment may monitor data acquired from the static elimination system 100 and the controller 110 and determine whether the electrostatic voltage of the semiconductor product is abnormal based on the acquired data. When the electrostatic voltage is determined to be abnormal, the management system 120 may perform an operation of comparing the electrostatic voltage with data acquired from other processes to determine whether the abnormality is a caused by an environmental factor, a transfer process problem, or a process problem.

According to one embodiment, temperature data, humidity data, and static electricity prediction data acquired from the static elimination system 100 are collected by a signal (communication) conversion unit 111 of the controller 110. Then, the signal (communication) conversion unit 111 produces and adjusts the algorithm, and exchanges information with an analysis and statistics processing unit 112. In addition, a speed of the wafer transfer robot calculated according to the algorithm is transmitted to the robot controller 113 through the signal (communication) conversion unit 111 to control the transfer speed of the robot. The data may be transmitted from the signal (communication) conversion unit 111 to the management system 120 through the network unit 121. When a wafer is placed on and picked up from an aligner, data on electrostatic voltage may be transmitted to the management system 120 to manage the results of static elimination. Meanwhile, when data that deviates from the algorithm is input or data having a high value is input, the management system 120 identifies whether it is caused by an environmental factor, a transfer process problem, or a process problem. For example, the environmental factors may be reviewed based on temperature and humidity data, and data from the current process may be compared with data from other processes to analyze problems.

Hereinafter, with reference to FIGS. 6 to 8, the operation of the wafer transfer robot control apparatus 10 of the wafer transfer robot using static electricity prediction will be described in detail in terms of a method.

A method of controlling a wafer transfer robot according to one embodiment of the present invention is a method of controlling a wafer transfer robot using static electricity prediction, and the method includes acquiring, when a wafer is transported by an end effector of the wafer transfer robot, temperature and humidity data around the wafer from a temperature sensor and a humidity sensor of a static elimination system installed in a non-contact manner with the end effector of the transfer robot, predicting an electrostatic voltage by substituting the acquired data into a predetermined humidity-electrostatic voltage graph, calculating a static elimination time of the predicted electrostatic voltage, performing static elimination on the wafer during the calculated static elimination time, and adjusting a transfer speed of the transfer robot based on the calculated static elimination time.

Figure 6:
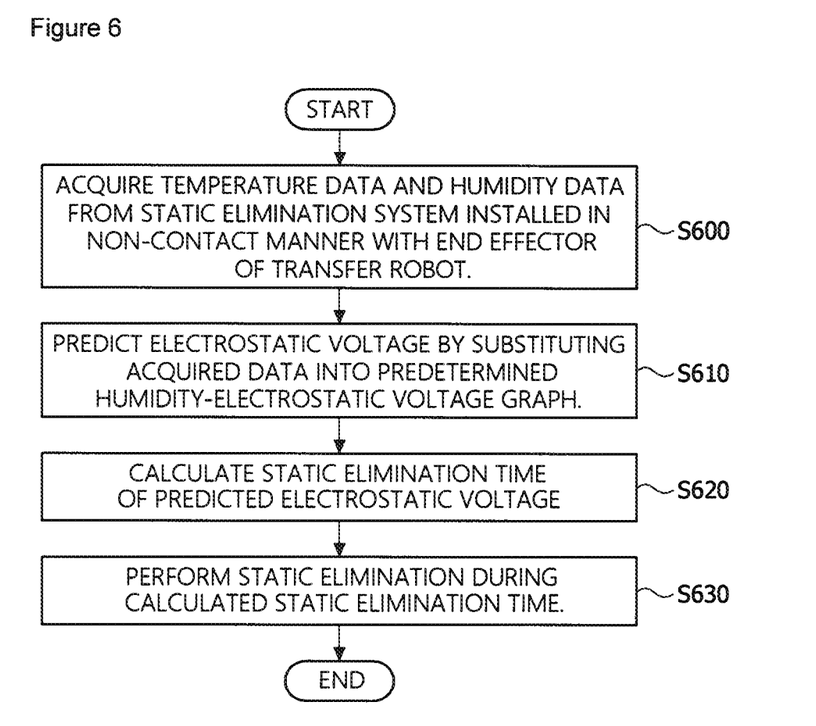
FIG. 6 is a flowchart for describing a method of controlling a wafer transfer robot using static electricity prediction according to one embodiment.

FIG. 6 is a flowchart for describing a method of controlling a wafer transfer robot using static electricity prediction according to one embodiment.

Referring to FIG. 6, in operation S600, the method of controlling a wafer transfer robot using static electricity prediction according to one embodiment acquires temperature data and humidity data through a static elimination system installed in a non-contact manner with an end effector of a transfer robot. Here, the static elimination system may be spaced apart from the end effector in the range of 50 to 200 mm.

In operation S610, the method of controlling the wafer transfer robot using static electricity prediction according to one embodiment predicts an electrostatic voltage by substituting the acquired data into a predetermined humidity-electrostatic voltage graph. In general, a surface resistance of a material may be controlled by the ambient humidity, and at humidity of 65% or more, most materials have sufficient surface conductivity to prevent static electricity accumulation. However, when the humidity falls to 30% or less, it becomes a good insulator and charge accumulation is increased.

Relative humidity may be calculated using Equation 1 below.

$$\text{Relative Humidity (\%)} = (\text{Amount of Current Water Vapor} / \text{Amount of Saturated Water Vapor}) \times 100 \quad \text{[Equation 1]}$$

However, when the temperature increases, the amount of saturated water vapor increases and the humidity decreases. For example, FIG. 7 is a graph showing a correlation between relative humidity and electrostatic voltage according to one embodiment. Here, the relative humidity-electrostatic voltage graph may be learned by measuring values that change depending on an environment and temperature of the transfer robot through the static elimination system. In addition, FIG. 7 is a graph showing a correlation between relative humidity and electrostatic voltage at one temperature, and when the temperature changes, the relative humidity and electrostatic voltage values of the correlation graph may also both change.

Figure 7:
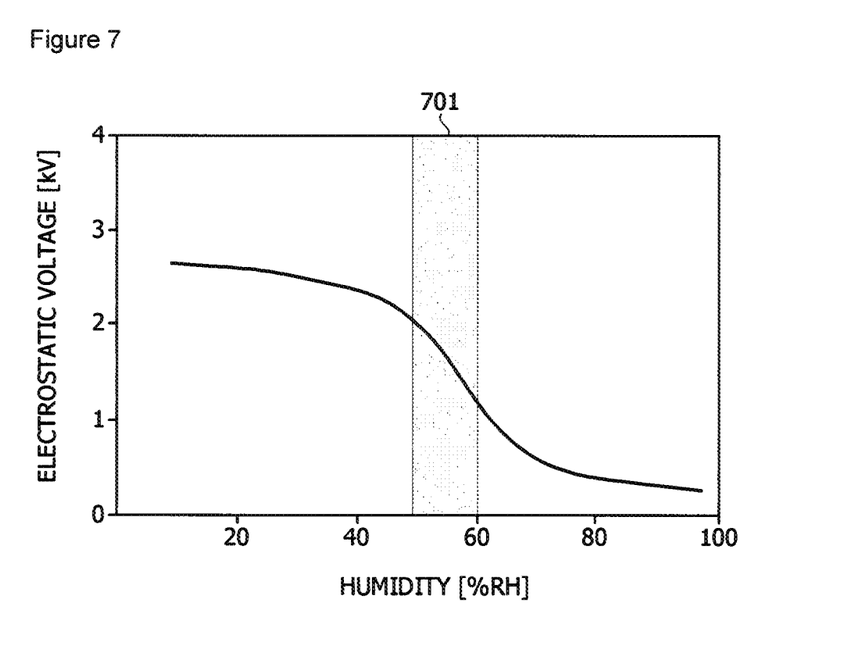
FIG. 7 is a graph showing a correlation between humidity and electrostatic voltage according to one embodiment.

Referring to FIG. 7, the static electricity is likely to occur in an area at a relative humidity of 60% or less, and the area 701 at a relative humidity of 50 to 60%, which is generally managed in the semiconductor manufacturing process, belongs to an area where static electricity is relatively likely to occur. Therefore, the method of controlling the wafer transfer robot using static electricity prediction according to one embodiment may substitute actual sensing data (temperature, humidity, and static electricity data) collected from the static elimination system into the relative humidity-electrostatic voltage graph shown in FIG. 7, and then may predict the electrostatic voltage by performing average, high average, and highest data statistics, and analysis processing using a statistical prediction method.

That is, since the relative humidity decreases depending on the temperature, when using the relative humidity-electrostatic voltage correlation shown in FIG. 7, the electrostatic voltage of the wafer may be predicted in consideration of the temperature data and humidity data together.

Next, in operation S620, the method of controlling the wafer transfer robot using static electricity prediction according to one embodiment includes calculating a static elimination time of the predicted electrostatic voltage. For example, the target electrostatic voltage is set to 250 V, and the static elimination time to the target electrostatic voltage may be calculated based on the performance data of the static eliminator included in the static elimination system. Next, an algorithm is created to calculate a required static elimination time for each electrostatic voltage based on the static elimination time to the target electrostatic voltage. Further, the algorithm may be repeatedly adjusted based on data acquired by the static elimination system.

Finally, in operation S630, the method of controlling the wafer transfer robot using static electricity prediction according to one embodiment includes performing static elimination during the calculated static elimination time. Here, the static elimination is not necessarily limited to being performed during the calculated static elimination time, and when the basic transfer speed of the transfer robot sufficiently meets the static elimination time, the static elimination may be performed during the basic transfer speed without any additional measures. Conversely, when the basic transfer speed of the transfer robot does not meet the static elimination time, the transfer speed of the robot may be adjusted to secure the static elimination time.

Figure 8:
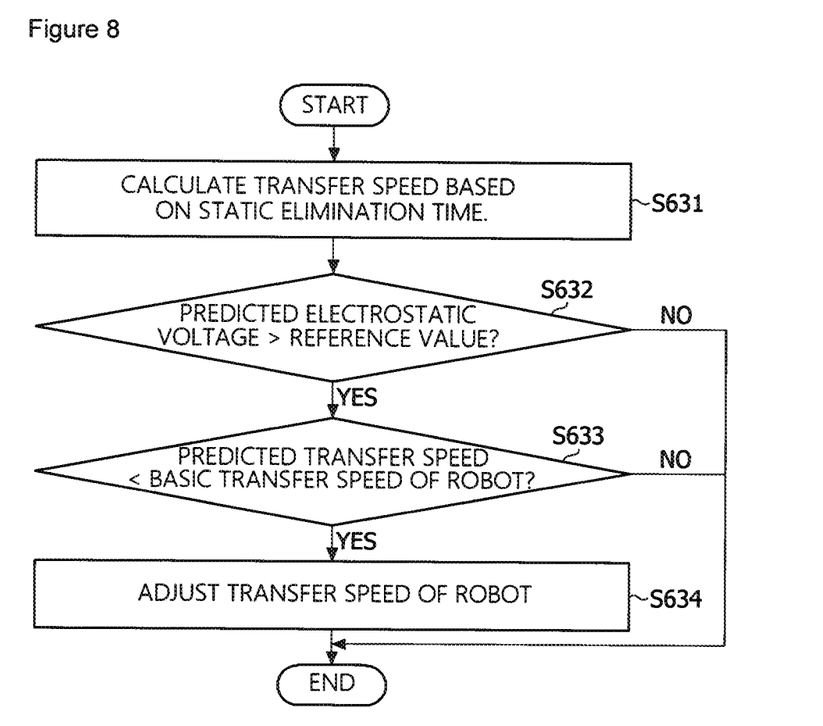
FIG. 8 is a flowchart for describing a method of controlling a speed of a wafer transfer robot according to one embodiment.

For example, FIG. 8 is a flowchart for describing a method of controlling a speed of a wafer transfer robot according to one embodiment.

Referring to FIG. 8, in operation S631, the method of controlling the speed of the wafer transfer robot according to one embodiment includes calculating the transfer speed based on a required static elimination time.

Then, proceeding to operation S632, the method of controlling the speed of the wafer transfer robot according to one embodiment includes not adjusting the transfer speed of the transfer robot because a separate static elimination operation is not required when the predicted electrostatic voltage is less than a reference value. Conversely, when the predicted electrostatic voltage is greater than the reference value, the process proceeds to operation S633.

In operation S633, the method of controlling the speed of the wafer transfer robot according to one embodiment proceeds to operation S634 only when the predicted transfer speed is less than the basic transfer speed of the robot, and includes adjusting the transfer speed of the robot to ensure sufficient static elimination time.

As described above, in the method of controlling the wafer transfer robot using static electricity prediction according to one embodiment, a non-contact type static elimination system is installed inside an equipment front end module that manufactures semiconductor products so that static electricity concentrated in the center of the wafer is predicted and eliminated without damaging the surface of the products. In particular, the static electricity prediction can be carried out using a temperature and humidity measured in the static elimination system so that the occurrence of static electricity can be more accurately predicted, and in addition, damage to semiconductor products caused by static electricity can be effectively prevented by creating sufficient static elimination time by linking with robots.

In particular, data on temperature, humidity, and an amount of static electricity can be monitored so that resources such as time and manpower in analyzing the cause of problems can be saved, and this data can be used to enable predictive maintenance.

For example, the charged amounts of the previous process and the current process can be compared by collecting data on the status of the charged amount and it is possible to identify which process is generating static electricity and take action accordingly.

Furthermore, since the amount of static electricity of the product can be checked by a non-contact type static elimination system, not only does it not cause any damage to the product, but it can also contribute to improving product yield by determining environmental factors such as temperature/humidity, transmitting data to the MES and EAP (FDC) side, and identifying factors that adversely affect the product.

The effects of the present invention are not limited to the effects mentioned above, and other effects that have not been mentioned will be clearly understood by those skilled in the art from the above detailed description.

The operations of the methods or algorithms described in connection with embodiments of the present invention may be implemented directly in hardware, implemented as a software module executed by hardware, or implemented as a combination thereof. The software module may reside in a random access memory (RAM), a read only memory (ROM), an erasable programmable ROM (PROM), an electrically erasable programmable ROM (EEPROM), a flash memory, a hard disk, a removable disk, a CD-ROM, or any other form of computer readable recording medium well known in the art to which the present invention belongs.

According to the present invention, a non-contact type static elimination system can be installed in an equipment front end module (EFEM) that manufactures semiconductor products so that static electricity concentrated in the center of the wafer can be predicted and eliminated without damaging a surface of the product. In particular, the static electricity prediction can be carried out using a temperature and humidity measured in the static elimination system so that the occurrence of static electricity can be more accurately predicted, and in addition, damage to semiconductor products caused by static electricity can be effectively prevented by creating sufficient static elimination time by linking with robots.

In particular, data on temperature, humidity and an amount of static electricity can be monitored so that resources such as time and labor force in analyzing the cause of problems can be reduced, and this data can be used to enable predictive maintenance.

For example, the charged amounts of a previous process and a current process can be compared by collecting data on the status of the charged amount and it is possible to identify which process is generating static electricity and take action accordingly.

Furthermore, since the amount of static electricity of the product can be checked by a non-contact type static elimination system, not only does it not cause any damage to the product, but it can also contribute to improving product yield by determining environmental factors such as temperature/humidity, transmitting data to the MES and EAP (FDC) side, and identifying factors that adversely affect the product.

The effects of the present invention are not limited to the effects mentioned above, and other effects that have not been mentioned will be clearly understood by those skilled in the art from the description below.

Although embodiments of the present invention have been described above with reference to the accompanying drawings, those skilled in the art to which the present invention belongs will understand that the present invention may be implemented in other specific forms without changing its technical idea or essential characteristics. Therefore, it should be understood that the embodiments described above are exemplary and not limited in all respects.

What is claimed is:

1. A method of controlling a wafer transfer robot using static electricity prediction, comprising:
   acquiring, when a wafer is transported by an end effector of the transfer robot, temperature and humidity data around the wafer from a temperature sensor and a humidity sensor of a static elimination system installed in a non-contact manner with the end effector of the transfer robot;
   predicting an electrostatic voltage by substituting the acquired data into a predetermined humidity-electrostatic voltage graph;
   calculating a static elimination time of the predicted electrostatic voltage;
   performing static elimination on the wafer during the calculated static elimination time; and
   adjusting a transfer speed of the transfer robot based on the calculated static elimination time.

2. The method of claim 1, wherein the predicting of the electrostatic voltage includes statistically predicting the electrostatic voltage by performing average, high average, and highest data statistics and analysis processing.

3. The method of claim 1, wherein the calculating of the static elimination time of the electrostatic voltage includes:
   setting a target electrostatic voltage;
   calculating the static elimination time to the target electrostatic voltage based on performance data of a static eliminator included in the static elimination system to calculate a required static elimination time according to the electrostatic voltage; and
   correcting the calculated static elimination time using the data acquired by the static elimination system.

4. The method of claim 1, wherein the adjusting of the transfer speed includes:

determining whether the predicted electrostatic voltage is greater than or equal to a predetermined value;

comparing, when the predicted electrostatic voltage is greater than or equal to the predetermined value, the transfer speed of the transfer robot according to the calculated static elimination time with a basic transfer speed of the transfer robot; and adjusting, when the basic transfer speed of the current transfer robot is higher than the transfer speed of the transfer robot according to the static elimination time, the transfer speed of the transfer robot to the transfer speed of the transfer robot according to the static elimination time.

5. The method of claim 1, wherein the static elimination system is spaced apart from the end effector in the range of 50 to 200 mm.

6. The method of claim 1, wherein the humidity-electrostatic voltage graph is learned by measuring values that change depending on an environment and temperature of the transfer robot through the static elimination system.

7. The method of claim 1, further comprising:
determining whether the electrostatic voltage is abnormal based on the acquired data; and
comparing, when the electrostatic voltage is determined to be abnormal, the electrostatic voltage with data acquired from other processes to determine whether the abnormality is caused by an environmental factor, a transfer process problem, or a process problem.

8. A program for controlling a wafer transfer robot using static electricity prediction, wherein the program is combined with a computer, which is hardware, and stored in a medium to execute the method of claim 1.

9. An apparatus for controlling a transfer robot, comprising:
a static elimination system installed in a non-contact manner with an end effector of the transfer robot to acquire temperature and humidity data around a wafer and perform static elimination on the wafer, when the wafer is transported by the end effector of the transfer robot;
a controller configured to predict an electrostatic voltage by substituting the acquired data into a predetermined humidity-electrostatic voltage graph and calculate a static elimination time of the predicted electrostatic voltage; and
a robot controller configured to adjust a transfer speed of the transfer robot based on the calculated static elimination time, wherein the controller controls the static elimination system to perform static elimination during the calculated static elimination time.

10. The apparatus of claim 9, wherein the controller statistically predicts the electrostatic voltage by performing average, high average, and highest data statistics and analysis processing.

11. The apparatus of claim 9, wherein the controller further performs:
setting a target electrostatic voltage,
calculating a static elimination time to the target electrostatic voltage based on performance data of a static eliminator included in the static elimination system to predict a required static elimination time according to an electrostatic voltage, and
correcting the predicted static elimination time based on the data acquired by the static elimination system.

12. The apparatus of claim 9, wherein the controller:
determines whether the predicted electrostatic voltage is greater than or equal to a predetermined value;
compares, when the predicted electrostatic voltage is greater than or equal to the predetermined value, the transfer speed of the transfer robot according to the calculated static elimination time with a basic transfer speed of the transfer robot; and
transmits, when the basic transfer speed of the current transfer robot is higher than the transfer speed of the transfer robot according to the static elimination time, an adjustment value by which the transfer speed of the transfer robot is adjusted to the transfer speed of the transfer robot according to the static elimination time to the robot controller.

13. The apparatus of claim 9, wherein the static elimination system is spaced apart from the end effector in the range of 50 to 200 mm.

14. The apparatus of claim 9, further comprising a management system,
wherein the management system performs:
determining whether the electrostatic voltage is abnormal based on the acquired data; and
comparing, when the electrostatic voltage is determined to be abnormal, the electrostatic voltage with data acquired from other processes to determine whether the abnormality is caused by an environmental factor, a transfer process problem, or process problem.

* * * * *